(12) United States Patent
Machkaoutsan et al.

(10) Patent No.: US 9,564,518 B2
(45) Date of Patent: Feb. 7, 2017

(54) METHOD AND APPARATUS FOR SOURCE-DRAIN JUNCTION FORMATION IN A FINFET WITH IN-SITU DOPING

(71) Applicant: QUALCOMM Incorporated, San Diego, CA (US)

(72) Inventors: Vladimir Machkaoutsan, Leuven (BE); Jeffrey Junhao Xu, San Diego, CA (US); Stanley Seungchul Song, San Diego, CA (US); Mustafa Badaroglu, Leuven (BE); Choh Fei Yeap, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/495,562

(22) Filed: Sep. 24, 2014

(65) Prior Publication Data

US 2016/0087070 A1    Mar. 24, 2016

(51) Int. Cl.
| | | |
|---|---|---|
| *H01L 21/336* | (2006.01) |
| *H01L 29/66* | (2006.01) |
| *H01L 29/78* | (2006.01) |
| *H01L 29/165* | (2006.01) |
| *H01L 29/10* | (2006.01) |

(52) U.S. Cl.
CPC ....... *H01L 29/6681* (2013.01); *H01L 29/1054* (2013.01); *H01L 29/165* (2013.01); *H01L 29/66803* (2013.01); *H01L 29/785* (2013.01); *H01L 29/7848* (2013.01); *H01L 29/7851* (2013.01); *H01L 29/66545* (2013.01)

(58) Field of Classification Search
None
See application file for complete search history.

(56) References Cited

U.S. PATENT DOCUMENTS

| | | | |
|---|---|---|---|
| 8,169,024 B2 | 5/2012 | Cheng et al. | |
| 8,420,464 B2 | 4/2013 | Basker et al. | |
| 8,551,829 B2 | 10/2013 | Chien et al. | |
| 8,729,607 B2 | 5/2014 | Itokawa et al. | |
| 9,245,882 B2 * | 1/2016 | Ching | H01L 27/0886 |

(Continued)

FOREIGN PATENT DOCUMENTS

WO    2009040707 A2    4/2009

OTHER PUBLICATIONS

Hashemi P., et al., "High-Performance Si1-xGex Channel on Insulator Trigate PFETs Featuring an Implant-Free Process and Aggressively-Scaled Fin and Gate Dimensions," Symposium on VLSI Technology Digest of Technical Papers, IEEE, 2013, pp. T18-T19.

(Continued)

*Primary Examiner* — Caleb Henry
(74) *Attorney, Agent, or Firm* — Muncy, Geissler, Olds & Lowe, P.C.

(57) ABSTRACT

A portion of a bulk silicon (Si) is formed into a fin, having a fin base and, on the fin base, an in-process fin. The fin base is doped Si and the in-process fin is silicon germanium (SiGe). The in-process SiGe fin has a source region and a drain region. Boron is in-situ doped into the drain region and into the source region. Optionally, boron is in-situ doped by forming an epi-layer, having boron, on the drain region and on the source region, and drive-in annealing to diffuse boron in the source region and the drain region.

17 Claims, 10 Drawing Sheets

(56) References Cited

U.S. PATENT DOCUMENTS

| | | |
|---|---|---|
| 2005/0112817 A1* | 5/2005 | Cheng ............. H01L 21/823807 |
| | | 438/219 |
| 2012/0319211 A1 | 12/2012 | Van Dal et al. |
| 2014/0061820 A1 | 3/2014 | Reznicek et al. |
| 2014/0120678 A1 | 5/2014 | Shinriki et al. |
| 2014/0131803 A1 | 5/2014 | Cheng et al. |
| 2014/0170839 A1 | 6/2014 | Brunco |
| 2014/0175543 A1 | 6/2014 | Glass et al. |
| 2014/0217483 A1* | 8/2014 | Choi ................. H01L 29/66545 |
| | | 257/288 |
| 2014/0252413 A1 | 9/2014 | Utomo et al. |
| 2014/0252475 A1* | 9/2014 | Xu ........................ H01L 29/785 |
| | | 257/347 |
| 2014/0264496 A1 | 9/2014 | Cheng et al. |
| 2014/0273379 A1 | 9/2014 | Tsai et al. |
| 2015/0091099 A1* | 4/2015 | Ching ............ H01L 21/823431 |
| | | 257/401 |

OTHER PUBLICATIONS

International Search Report and Written Opinion—PCT/US2015/050694—ISA/EPO—Dec. 2, 2015.

* cited by examiner

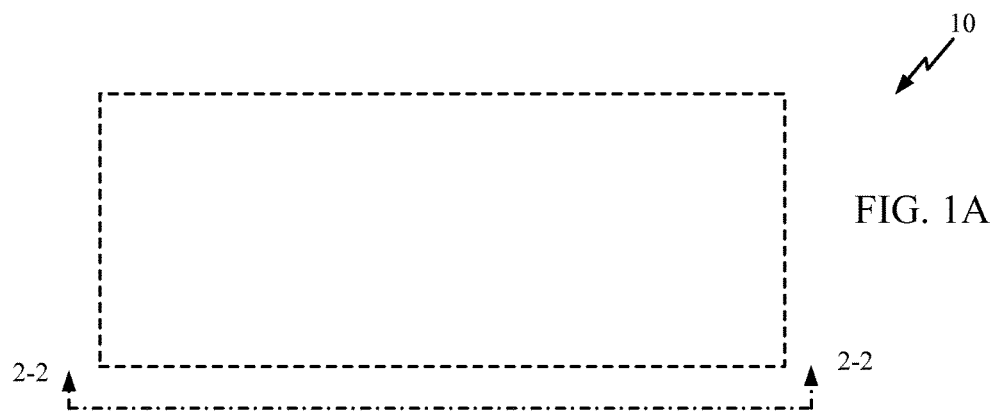
FIG. 1A
FIG. 1B
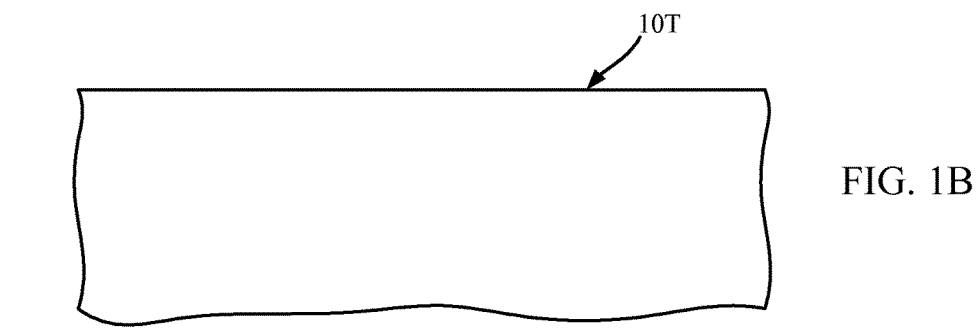
FIG. 2
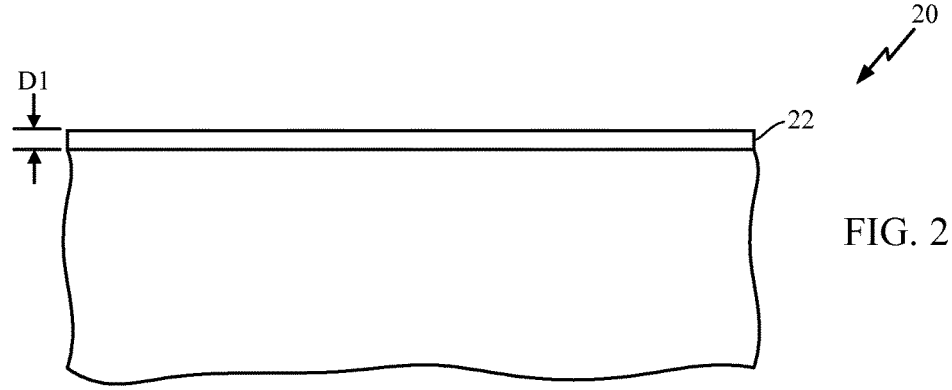
FIG. 3

METHOD AND APPARATUS FOR SOURCE-DRAIN JUNCTION FORMATION IN A FINFET WITH IN-SITU DOPING

FIELD OF DISCLOSURE

The present application generally relates to transistor structure and, more particularly, to FinFET devices.

BACKGROUND

Source-Drain (S/D) doping in scaled Si channel based bulk FinFET devices can be built by embedding highly in-situ doped epilayers into recessed S/D areas of a transistor. The in-situ doped epilayers, according to their structure and material, are able to efficiently introduce strain into the Si channel and dopants into the S/D junctions. The combination of the introduced strain and the dopants can provide increased channel mobility, improved short channel behavior and reduced parasitic S/D resistance.

The introduction of strain by in-situ doped epilayers may not obtain such mobility benefit in SiGe channel based FinFETs. For example, a SiGe channel has inherent strain even without any S/D epitaxy. Recessing Source-Drain may result in partial elastic SiGe strain relaxation in the channel region. However, SiGe FinFET devices can still require sufficiently high and conformal junction doping levels over the entire height of the SiGe channel.

SUMMARY

The following summary touches on certain examples in accordance with one or more exemplary embodiments. The summary is not a defining overview of all exemplary embodiments or contemplated aspects. The summary is not intended to prioritize or even identify key elements of all aspects, and is not intended to limit the scope of any embodiment or any aspect of any embodiment.

Disclosed methods can fabricate a FinFET, for example in bulk silicon (Si), and example operations can include forming a fin stack in a portion of the bulk Si, the fin stack may include a fin base and, on the fin base, a silicon germanium (SiGe) in-process fin, and further operations may include in-situ boron doping a region of the SiGe in-process fin.

In an aspect, disclosed methods can include, in the in-situ boron doping of the region of the SiGe in-process fin, operations of depositing an epi layer, configured such that the epi layer may comprise boron, and to form the epi layer on at least a portion of an outer surface of the SiGe in-process fin, followed by applying a drive-in annealing. In a further aspect, the drive-in annealing may be configured to diffuse boron from the epi layer into the region of the SiGe in-process fin.

In an aspect, disclosed methods can include example operations in forming the fin stack being configured to form the SiGe in-process fin as a lightly doped SiGe in-process fin.

Example apparatuses according to various exemplary embodiments can include bulk silicon, having etched trenches spaced apart by a fin stack, the fin stack having a doped Si fin base and, on the doped Si fin base, a lightly doped in-process SiGe fin. In an aspect, example apparatuses can include an epi layer, and the epi layer may be on an outer surface of the lightly doped in-process SiGe fin. In an aspect, the epi layer may comprise SiGeB. In a further aspect, the lightly doped in-process SiGe fin may include a source region and a drain region, and the epi layer, for example the SiGeB epi layer may be on, or may cover an outer surface of the drain region, and an outer surface of the source region.

Example apparatuses according to other exemplary embodiments can include a fin stack, and the fin stack may comprise a doped Si fin base and, on the doped Si fin base, a SiGe fin having a source region and a drain region. In an aspect, example apparatuses can include means for in-situ doping the source region with boron and in-situ doping the drain region with boron. In an aspect, means for in-situ doping the source region with B and in-situ doping the drain region with boron may be configured to receive an annealing heat and, in response, to diffuse boron into the drain and region and into the source region.

Example apparatuses according to other exemplary embodiments can include a stack having a Si fin base and, on the doped Si fin base, a SiGe fin, and the SiGe fin may include a boron doped source region and a boron doped drain region. In an aspect, example apparatuses can include an epi layer, which may on at least a portion of an outer surface of the boron doped source region, or an outer surface of the boron doped drain region, or both, and the epi layer may comprise SiGeB.

BRIEF DESCRIPTION OF THE DRAWINGS

The accompanying drawings are presented to aid in the description of embodiments of the disclosure and are provided solely for illustration of the embodiments and not limitation thereof FIG. 1A shows a top projection view of one example starting bulk silicon.

FIG. 1B shows a front cross-sectional view of the one example starting bulk silicon, on the FIG. 1A cut-plane 2-2.

FIG. 2 is a front cross-sectional view reflecting a depositing of an example dielectric layer on a surface of the FIG. 1A-1B bulk silicon, in operations further to one example fabrication process.

FIG. 3 is a front cross-sectional view reflecting doping operations to form, under the dielectric layer of the FIG. 2 in-process structure, a lightly doped Si layer above a doped ground plane Si layer, further to one example fabrication process.

DETAILED DESCRIPTION

Figure 4:
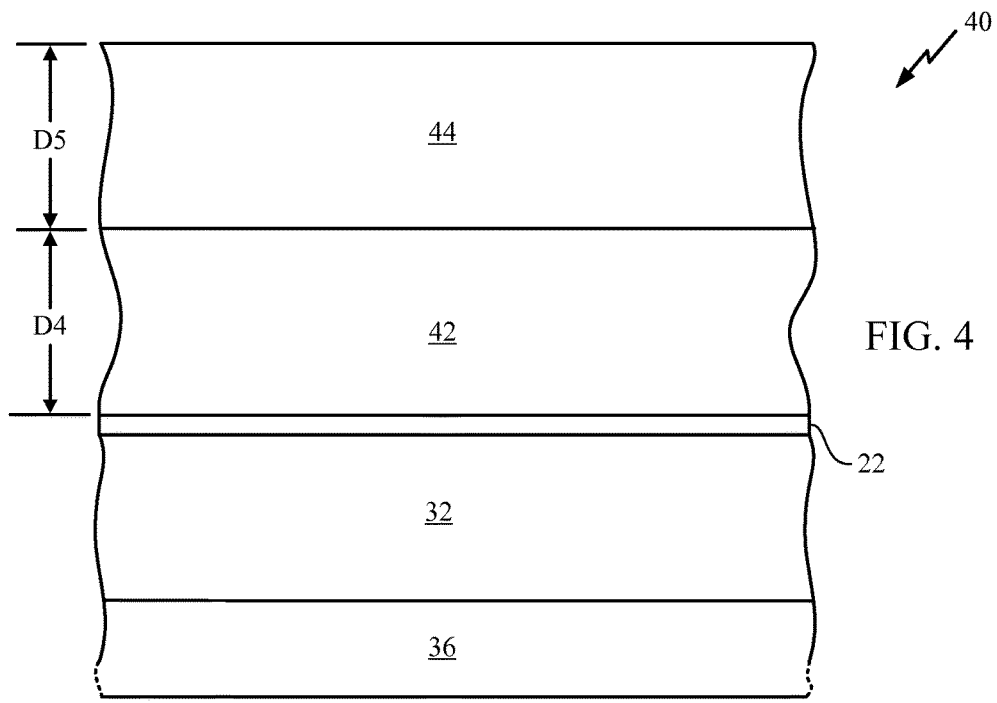
FIG. 4 is a front cross-sectional view reflecting a depositing, on the dielectric layer of the FIG. 3 in-process structure, a nitride layer and, on the nitride layer, a hard mask layer, in operations further to one example fabrication process.

Aspects of the disclosure are disclosed in the following description and related drawings directed to specific embodiments of the disclosure. Alternate embodiments may be devised without departing from the scope of the disclosure. Additionally, well-known elements of the disclosure will not be described in detail or will be omitted so as not to obscure the relevant details of the disclosure.

The word "exemplary" is used herein to mean "serving as an example, instance, or illustration." Any embodiment described herein as "exemplary" is not necessarily to be construed as preferred or advantageous over other embodiments. Likewise, the term "embodiments of the disclosure" does not require that all embodiments of the disclosure include the discussed feature, advantage or mode of operation.

The terminology used herein is for describing particular examples illustrating various embodiments, and is not intended to be limiting of embodiments of the disclosure. As used herein, the singular forms "a", "an" and "the" are intended to include the plural forms as well, unless the context clearly indicates otherwise. It will be understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed or controlled by, for example, elements of a computing device. It will be recognized that various actions described herein can be performed by specific circuits (e.g., application specific integrated circuits (ASICs)), by program instructions being executed by one or more processors, or by a combination of both. Additionally, these sequences of actions described herein can be embodied entirely within any form of computer readable storage medium having stored therein a corresponding set of computer instructions that upon execution would cause an associated processor to perform the functionality described herein. Thus, the various aspects of the disclosure may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Methods according to various exemplary embodiments can provide fabricating a FinFET on a bulk silicon, through operations that can include forming a fin stack, in a portion of the bulk silicon, such that the fin stack has a fin base and, on the fin base, a silicon germanium (SiGe) in-process fin. In an aspect, methods according to various exemplary embodiments can further include in-situ boron doping a region of the SiGe in-process fin. In an aspect, in-situ boron doping the region of the SiGe in-process fin can include depositing an epi layer, the epi layer comprising boron. The epi layer may be formed on an outer surface of the SiGe in-process fin. In an aspect, the epi layer may comprise SiGeB. In an aspect, in-situ boron doping region of the SiGe in-process fin can further include applying a drive-in annealing, and the drive-in annealing may be configured to diffuse boron from the epi layer into the region of the SiGe in-process fin. In a further aspect, the fin base may be a Si fin base.

In an aspect, methods for fabricating a FinFET according to various exemplary embodiments may form the SiGe in-process fin as a lightly doped SiGe in-process fin.

In an aspect, the SiGe in-process fin may have a source region and a drain region. For example, the source region may be at one end of the SiGe in-process fin and the drain region may be at the other, opposite, end of the SiGe in process fin. In a related aspect, in-situ boron doping may be configured to in-situ boron dope at least a portion of the source region and at least a portion of the drain region. Examples according to this aspect can include forming the epi layer, for example as a SiGeB epi layer on an outer surface of the source region and on an outer surface of the drain region. Operations such as drive annealing may then be applied, to diffuse boron from the epi layer into the source region and into the drain region, resulting in a boron-doped source region, and a boron-doped drain region.

In an aspect, an epi layer that contains boron, such as the described SiGeB epi layer can provide novel means for in-situ boron doping the source region and in-situ boron doping the drain region. Such means can be viewed as a novel means for receiving an external heat, for example, a drive-in annealing heat and, in response, diffusing boron into the source region and into the drain region.

FIG. 1A shows a top projection view of one example of a starting bulk silicon 10 (hereinafter "bulk Si" 10). It will be understood that the structure visible in FIG. 1A as the bulk Si 10 may be a region or area of a larger bulk silicon (not explicitly visible in FIGS. 1A and 1B), e.g., a region of a die, or of a wafer prior to dicing into multiple dies.

FIG. 1B shows a front cross-sectional view of the bulk Si 10, viewed on the FIG. 1A cut-plane 2-2. Referring to FIG. 1B, the bulk Si 10 has a top surface 10T. It will be understood "top surface 10T" is an arbitrary label, and that "top," in the context of "top surface 10T" carries no meaning or limitation regarding orientation with respect to any external reference. A bottom reference line "BT" demarcates an arbitrary depth position in the bulk Si 10. The bottom reference line BT may, but does not necessarily, represent a bottom surface of the bulk Si 10.

FIG. 2 is a front cross-sectional view of an in-process structure 20 formed by depositing a dielectric layer 22 on the top surface 10T of the FIG. 1A-1B bulk Si 10. As will be understood by persons of ordinary skill upon reading this disclosure, operative aspects of the dielectric layer 22 can include relief of a stress that may result from subsequent depositing of a silicon nitride (SiN) layer (not visible in FIG. 2). In an aspect, operative aspects of the dielectric layer 22 may also include protection of channel material during subsequent forming, in order of depth under the top surface 10T, a light doped layer (not visible in FIG. 2) above a doped ground plane layer (not visible in FIG. 2).

The dielectric layer 22 may be formed, for example, of SiOx, with a thickness D1. Regarding selection of a range for D1, various considerations will become apparent to persons of ordinary skill upon reading the present disclosure. For example, it will become apparent that if D1 is selected overly thin there may be possibility of the dielectric layer 22 providing less than desired relief of stress from subsequent depositing (not visible in FIG. 2) the silicon nitride. Another consideration in selecting the range of D1 that will become apparent to such persons upon reading this disclosure is that if D1 is too thick, there may be a resulting unwanted blockage of implant operations in the forming, under the top surface 10T, of a later described lightly doped layer (not visible in FIG. 2) above a doped ground plane layer (not visible in FIG. 2). Another consideration in selecting the range of D1 that will become apparent to such persons upon reading this disclosure is that if D1 is too thick, there may be a possibility of unwanted erosion during later-described fin patterning operations. On these and other considerations that will become apparent to persons of ordinary skill upon reading the present disclosure, selecting a range for D1 for given applications may be readily performed, without undue experimentation. As one illustrative example, one contemplated range of thicknesses D1 that may be used in certain applications may include a thickness that is approximately 10% of the thickness of the silicon nitride layer (not visible in FIG. 2). It will be also be understood that this illustrated example range of 10% is only one example, and is not intended to limit scope of any embodiments or aspects thereof.

FIG. 3 is a front cross-sectional view of a next in-process structure 30, reflecting doping operations to form, to a depth D2 under the top surface 10T, a lightly doped Si layer 32 and, under the lightly doped layer, a doped ground plane layer 34 having a thickness D3.

For purposes of this description, "lightly doped," in the context of "lightly doped Si layer 32," can include non-zero doping that does not result in substantive change in electrical performance relative to the bulk Si. Persons of ordinary skill will understand upon reading this disclosure that numerical values of "lightly doped" within this meaning may be application specific. For purposes of illustration, and without limiting the scope of "lightly doped" as used in this description," one example range may include approximately $1E17$ at/cm$^3$.

It will be understood that numerical values that constitute "doped," in the context of "doped ground plane layer 34," may be application specific. Persons of ordinary skill in the art, though, upon reading this disclosure, can readily determine ranges of numerical values that constitute "doped," in the context of "doped" ground plane layer 34, without undue experimentation. For example, such persons will appreciate, upon reading this disclosure, that numerical values corresponding to "doped" may be limited or constrained, at a lower end, by values below which there may be an unacceptable inefficiency in ground plane function. Such persons will also appreciate, upon reading this disclosure, that numerical values corresponding to "doped" may be limited or constrained, at an upper end, by values above which one or more undesired effects, e.g., excess channel doping in later formed, lightly doped SiGe active fins (not visible in FIG. 3) may result. For purposes of illustration, and without limiting the scope of "doped" as used in association with "doped ground plane layer 34," one example range of "doped" may span from less than approximately $1E18$ at/cm$^3$, and may extend up to and beyond $5E18$ at/cm$^3$.

Regarding techniques for forming the doped ground plane layer 34 and the lightly doped Si layer 32, persons of ordinary skill in the art, upon reading the present disclosure, can readily adapt various known, conventional doping techniques without undue experimentation. For example, such persons, upon reading the present disclosure, can configure conventional doping techniques to form the doped ground plane layer 34, and to form the lightly doped layer 32 as incidental to the forming of the doped ground plane layer 34, as opposed to being a separate processing step. More particularly, in one example, conventional doping techniques (not specifically visible in FIG. 3) may be configured to obtain a desired peak concentration over a range of depth from D2 to D2+D3 below the surface 10T. Persons of ordinary skill in the art, upon reading the present disclosure, can configure such conventional doping techniques to provide that retrograde doping profile, i.e., having the desired peak concentration over a range of depth from D2 to D2+D3 below the surface 10T, and a light doping tail over D2. Such configuration of conventional doping techniques may provide the doped ground plane layer 34 and the lightly doped layer 32 in one implant step. Persons of ordinary skill in the art will also understand, upon reading this disclosure, that two or more conventional-technique implant steps may be adapted to obtain a desired doping for the doped ground plane layer 34 and the lightly doped Si layer 32.

Regarding ranges of numerical values for D3, considerations in specifying D3 will become apparent to persons of ordinary skill in the art upon reading the present disclosure, by which such persons can, given an application, specify an appropriate range for D3 without undue experimentation. For example, persons of ordinary skill in the art will understand, upon reading this disclosure, that operations of the doped ground plane layer 34 can include prevention of, or preventing a possibility of a creation of, a parasitic sub-fin leakage path under the SiGe active fin of the end product.

Such persons will also appreciate, upon reading this disclosure, that operations of the doped ground plane layer 34 can include providing electrical isolation of NFET and PFET regions (not explicitly visible in FIG. 3). For purposes of illustration, and without limiting the scope of any embodiments, one example range of D3 may encompass and include a range extending down to 30 nm, for purposes of suppressing sub-fin leakage under the SiGe active fin of the end product. Persons of ordinary skill in the art will also understand that well doping for NFET and PFET isolation may extend down to an STI oxide bottom which can include, but is not limited to, 100-150 nm.

Regarding ranges of numerical values for the thickness D2, persons of ordinary skill in the art will understand upon reading this disclosure that such numerical values can depend, at least in part, on the specified height (not explicitly visible in FIG. 3) of the end product's SiGe active fin (not specifically visible in FIG. 3) which will be described in greater detail in later paragraphs. For example, in an aspect, the thickness D2 may be selected to be close to or slightly deeper than the specified height of the end product's SiGe active fin. Persons of ordinary skill in the art will understand upon reading this disclosure that a potential result of an overly small D2 could be a portion of the end product's SiGe active fin remaining in an off state, i.e., a potential reduction in on-state current. Such persons will also understand upon reading this disclosure that one potential result of an overly large D2 may be the doped ground plane layer 34 having such distance from the end product's SiGe active fin as to adversely affect its operation of prevention of sub-fin leakage. For purposes of illustration, and without limiting the scope of embodiments, one example range of D2 may encompass and include a range extending from less than 30 nm and up to and exceeding 60 nm It will be understood that doping operations may form a gradient transition between the lightly doped Si layer 32 and the doped ground plane layer 34, as opposed to a step boundary. Persons of ordinary skill will understand upon reading this disclosure that such a gradient may depend in part on the technique selected for forming the doped ground plane layer 34. For example, such persons will appreciate upon reading this disclosure that the doped ground plane layer 34 may be formed by implantation, and will understand that implantation may form a more extended gradient than other techniques.

In an aspect, operations may include forming a fin-pattern hard mask on the above-described in-process structure having the lightly doped Si layer 32 upon the doped ground plane layer 34, the fin-pattern hard mask formed as a top projection plan of one or more fins. Operations may include applying an etching process, using the fin-pattern hard mask, to the lightly doped Si layer 32 and to the doped ground plane layer 34, to form one or more fin stacks. The fin stacks will include a fin base formed of a portion of the doped ground plane layer 34 and, on the fin base, an in-process lightly doped Si fin formed of a portion of the lightly doped Si layer 32. In an aspect, the fin-pattern hard mask and etching process may be configured to form a single fin stack. In a further aspect, the fin-pattern hard mask and etching process may be configured to form a plurality of fin stacks, for example, a set of parallel fin stacks, spaced apart by a fin pitch. One example of operations in forming a fin-pattern hard mask will be described in reference to FIGS. 4 and 5.

FIG. 4 is a front cross-sectional view of an in-process structure 40, reflecting a depositing, on the dielectric layer 22 of the FIG. 3 in-process structure 30, of a nitride layer 42 and, on the nitride layer 42, a hard mask layer 44, in operations further to one embodiment. Referring to FIG. 4, the nitride layer 42 may have a depth D4, and the hard mask layer 44 may have a thickness D5. In an aspect, subsequent operations (not visible in FIG. 4) can form a fin pattern (not visible in FIG. 4) in the hard mask layer 44, and can utilize the nitride layer 42 to transfer that fin pattern into fin stacks (not visible in FIG. 4), for example, by anisotropic dry etching. Referring to FIG. 4, the hard mask layer 44 is visibly represented as a single layer. The visible representation as a single layer, though, is not intended to limit the hard mask 44 to a single layer structure. Instead, embodiments contemplate structures implementing the hard mask layer 44 as comprising a stack of multiple hard mask layers (not separately visible in FIG. 4) on the nitride layer Conventional hard mask techniques using such stacked hard mask layers, for example, Spacer Defined Double and Quadruple Patterning (SADP, SAQP) are known to persons of ordinary skill in the art. Such conventional hard mask techniques can be configured by such persons having possession of the present disclosure to practice in accordance with exemplary embodiments, without undue experimentation and, therefore, further detail description is omitted.

Regarding selection of respective numerical ranges for D4 and D5, persons of ordinary skill, given an application and having view of the present disclosure, can readily determine such numerical ranges through use of general convention engineering methodologies and knowledge of conventional hard mask and etching techniques that such persons possess, without undue experimentation. Regarding D4, for purposes of illustration, and without limiting the scope of embodiments, one example range of numerical values that may be used may encompass, but is not limited to, approximately ⅓ of the STI depth (not explicitly visible in FIG. 4). One specific example range of numerical value for D4 that may be used may encompass and include a range extending from less than 25 nm and up to and exceeding 40 nm. Regarding D5, considerations that will become apparent to persons of ordinary skill in the art upon reading this disclosure, for specifying or selecting a range of numerical values D5, is that the values may be comparable to or, in one aspect, slightly larger than D4. More particularly, it will become apparent to such persons that it may be, but is not necessarily preferable, that at least a small portion of the hard mask layer 44 remain atop the nitride layer 42 at the end of the fin etching. One specific example range of numerical value for D5 that may be used, for example, together with the described specific example range for D4, may encompass and include a range extending from less than 30 nm and up to and exceeding 40 nm.

Figure 5:
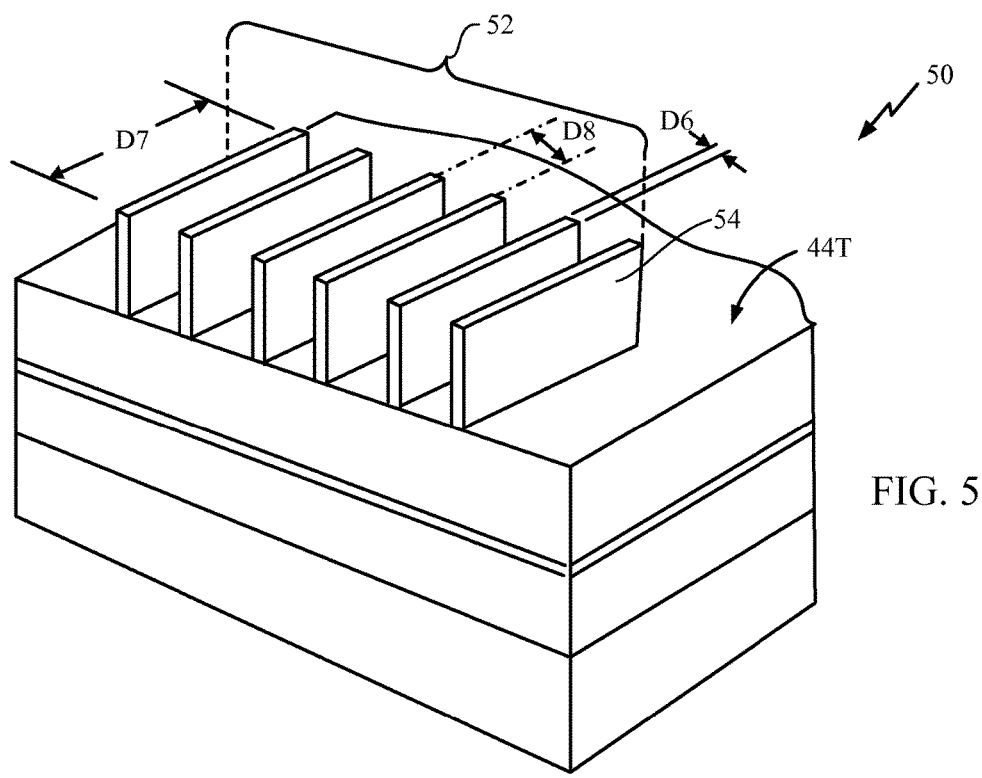
FIG. 5 is a front cross-sectional view reflecting a patterning, in the hard mask layer of the FIG. 4 in-process structure, of a patterned hard mask for subsequent etching in-process fin stacks, in operations further to one example fabrication process.

FIG. 5 is a perspective view of an in-process structure 50 reflecting a patterning, in the hard mask layer 44 of the FIG. 4 in-process structure 40, to form a fin patterned hard mask 52 for subsequent etching of a plurality of fins (not explicitly visible in FIG. 5), in operations further to one embodiment. The patterned hard mask 52 includes, for purposes of illustration, six fin hard masks, of which the fin hard mask 54 is one representative example. It will be understood that six is only one example quantity of fin hard masks forming a patterned hard mask such as the fin patterned hard mask 52, and is not intended to limit any embodiments or aspects of the same. For example, alternative patterned hard masks (not explicitly visible in FIG. 5) may have seven or more, or five or less fin hard masks, or may have just one fin hard mask. Referring to FIG. 5, the fin patterned hard mask 52 shows all six of the fin hard masks having the same width D6 and length D7. However, this is only for purposes of example, as alternatives are contemplates that may form different ones of the fin patterned hard masks with respectively different widths and lengths. Similarly, the fin patterned hard mask 52 shows all six of the fin hard masks equally spaced by a fin pitch D8, but this is only for purposes of example, as alternatives are contemplated that may form fin hard masks spaced apart by varying fin pitches.

Figure 6:
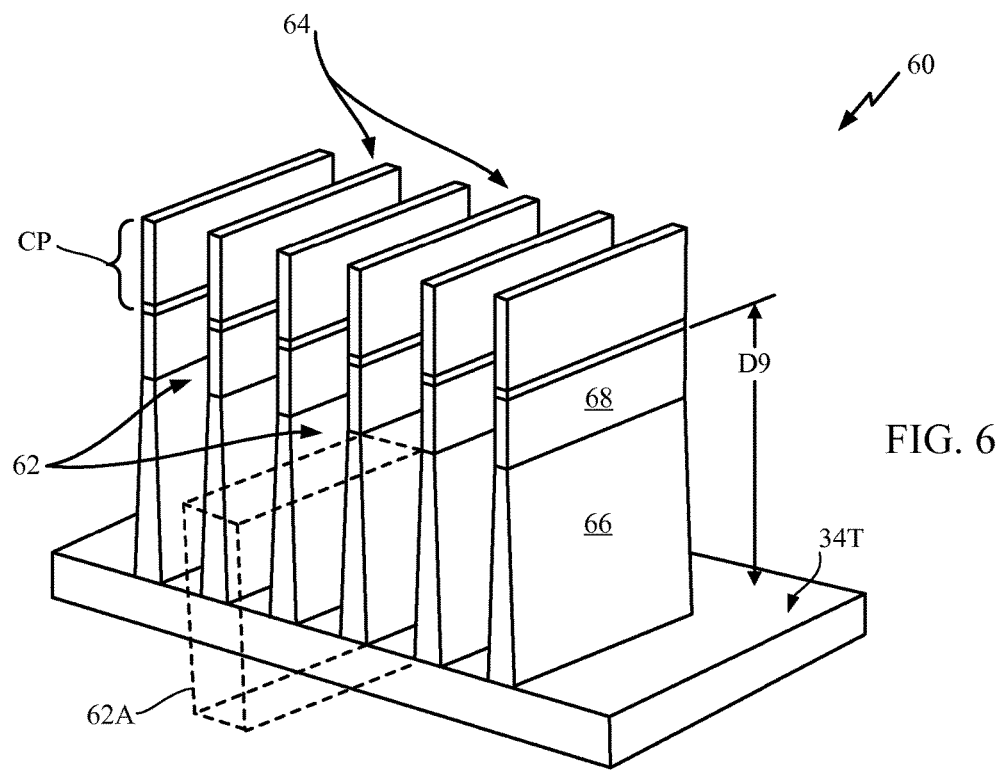
FIG. 6 is a front cross-sectional view reflecting an etching of in-process fin stacks using the patterned hard mask shown formed in FIG. 5, in operations further to one example fabrication process.

FIG. 6 is a perspective view of an in-process structure 60 reflecting an etching of trenches 62 in the FIG. 5 in-process structure 50 to form in-process fin stacks 64 using the fin patterned hard mask 52, followed by a removal of that fin patterned hard mark 52. Referring to FIG. 6, one example etching can etch the trenches 62 through the nitride (e.g., Si3N4) layer 42, through the dielectric layer 22, through the lightly doped Si layer 32, and into the doped ground plane layer 34. Such example etching can etch the trenches to a total depth D9, measured from the top surface (shown but not separately numbered) of the lightly doped Si layer 32 to a recess bottom surface 34T in the doped ground plane layer 34. The trenches 62 may include corresponding recesses 62A etched into the doped ground plane layer 34. The in-process fin stacks 64 each include, in ascending order starting from the recess bottom surface 34T, a fin base 66 and, on a top surface of the fin base 66, an in-process silicon fin 68. It will be appreciated that the fin base 66 of each of the in-process fin stacks is a portion of the doped ground plane layer 34 between the respective pair of the trenches 62, and that the in-process Si fin 68 is a portion of the lightly doped Si layer 32 between the respective pair of trenches. The in-process fin stacks 64 can each include a temporary cap CP, wherein the temporary cap CP a remaining portion of the dielectric layer 22 and, on the remaining portion of dielectric layer 22, a remaining portion of the Si3N4 layer.

In an aspect, operations further to methods according to various exemplary embodiments may include filling each of the respective pair of trenches with a Si isolation material, to a height that provides a Si isolation material intermediate upper surface. Further to this aspect, the filling may be configured so that the height of the Si isolation material intermediate upper surface leaves an exposed outer surface of the lightly doped in-process Si fin. In another aspect, the filling of each of the respective pair of trenches may include filling to a height greater than that of the intended Si isolation material surface, followed by an etching to the intended height. In a further aspect, the filling to a height greater than that of the intended Si isolation material upper surface may include filling to a height of the in-process fin stacks, followed by a planarizing and then an etching.

Figure 7:
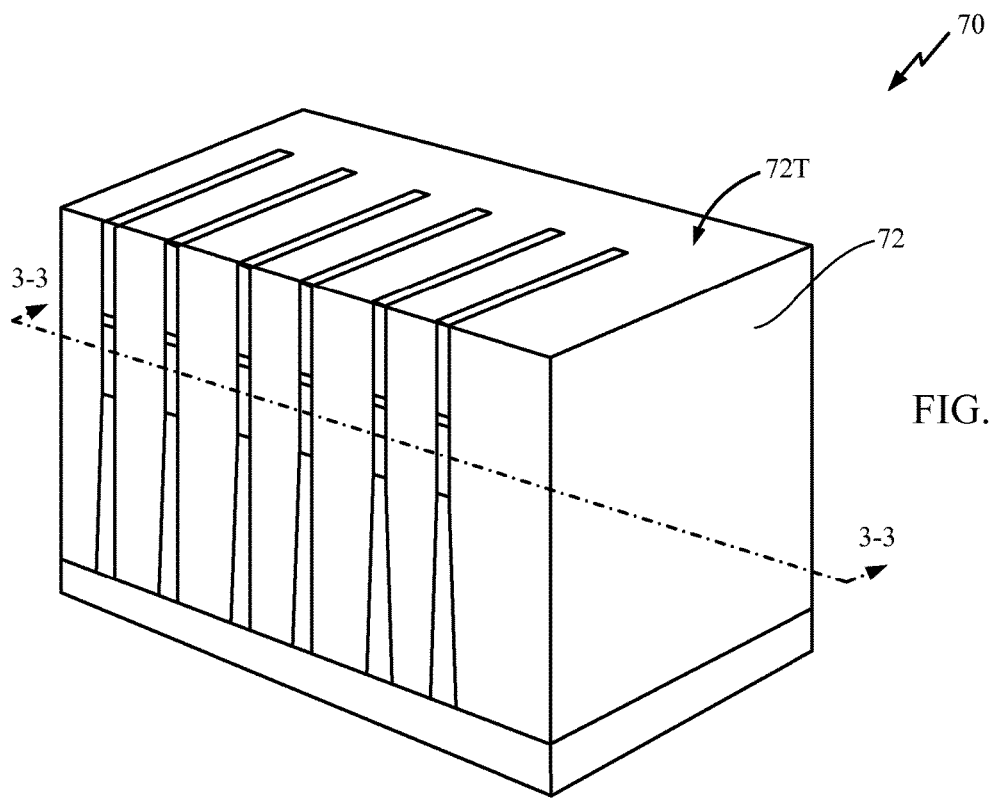
FIG. 7 shows a perspective view reflecting silicon isolation filling and planarizing of the FIG. 6 in-process structure, in operations further to one example fabrication process.

FIG. 7 shows a perspective view of one in-process structure 70, reflecting removal of the patterned hard mask 52 and deposition of an oxide filling 72 into the trenches 62 of the FIG. 6 in-process structure 60, followed by planarizing, in operations further to one example fabrication process. Referring to FIG. 7, the planarizing may form a temporary upper planar surface 72T.

Figure 8:
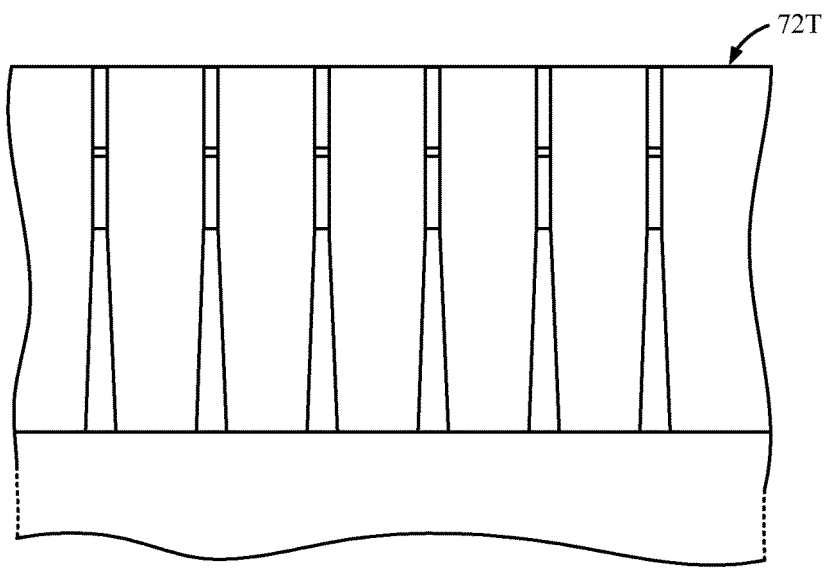
FIG. 8 is cross-sectional view, on the FIG. 7 cut-plane 3-3, of the in-process structure shown by that figure.

FIG. 8 is cross-sectional view, on the FIG. 7 projection plane 3-3, of the in-process structure 70 shown by that figure.

Figure 9:
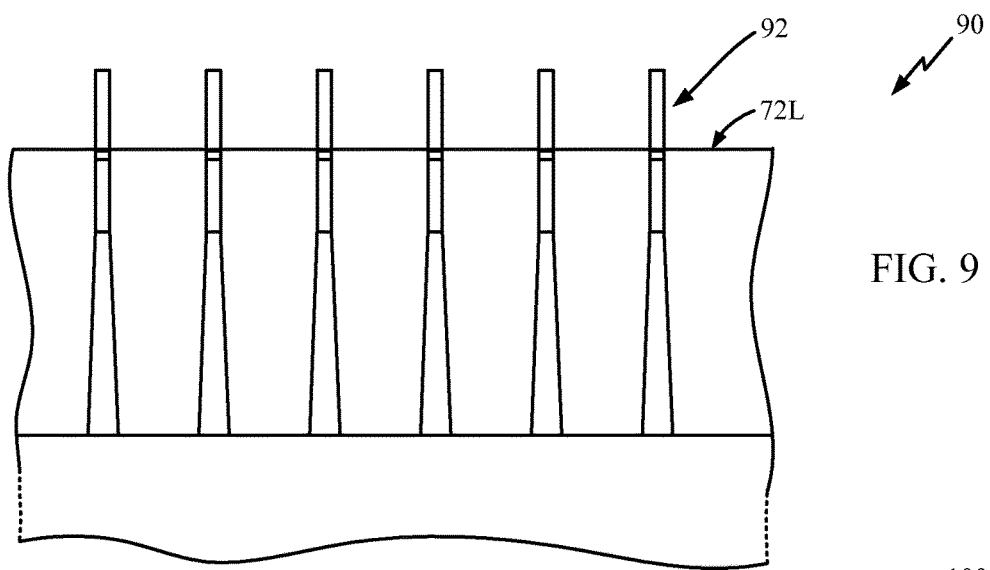
FIG. 9 is a cross-sectional view, reflecting etching the silicon isolation material of the FIG. 8 in-process structure, leaving exposed nitride layer portions on in-process fin stacks, in operations further to one example fabrication process.

FIG. 9 is a cross-sectional view of an in-process structure 90, reflecting etching the oxide fill of the FIG. 8 in-process structure, leaving exposed nitride layer portions 92, in operations further to one example fabrication process.

Figure 10:
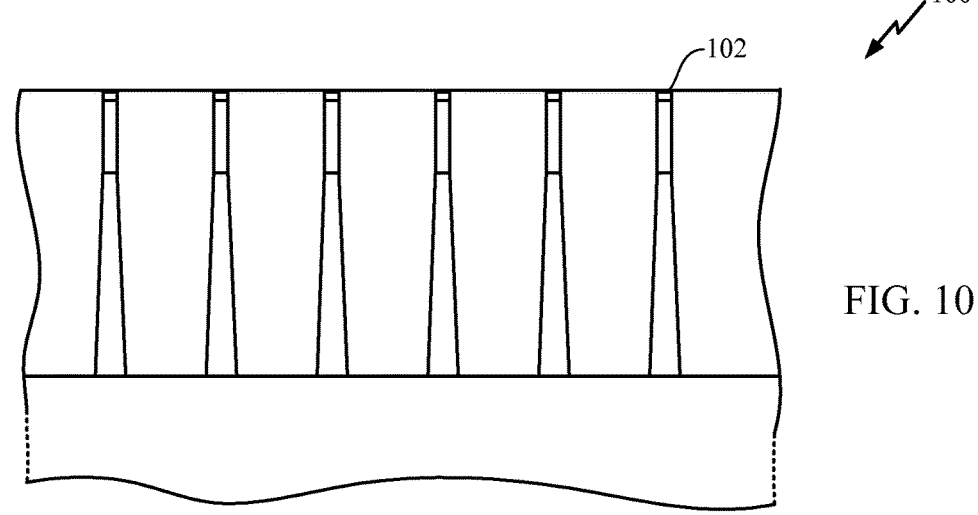
FIG. 10 is a cross-sectional view reflecting removing exposed nitride layer portions of the FIG. 9 in-process fin stacks, in operations further to one example fabrication process.

FIG. 10 is a cross-sectional view of an in-process structure 100 reflecting removing the exposed nitride layer portions 92 of the FIG. 9 in-process structure 90, and forming another temporary planar top surface 72L of the oxide filling 72, in operations further to one example fabrication process. Referring to FIG. 10, portions 102 of the dielectric layer 22, formed as shown in FIG. 2, remain on the respective tops (shown but not separately labeled) of each of the in-process fin stacks (labeled by reference number "64" in FIG. 6, visible but not labeled on FIG. 10).

Figure 11:
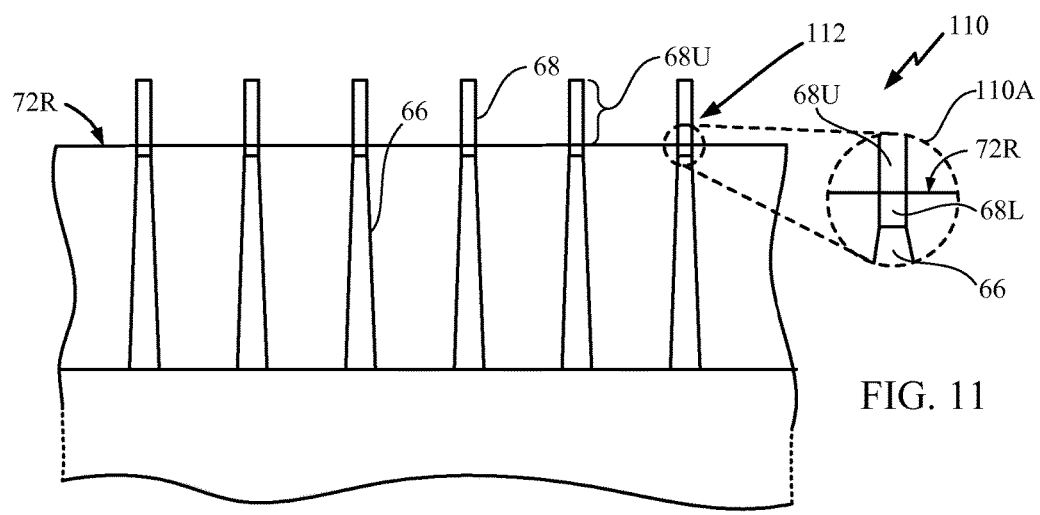
FIG. 11 shows a cross-sectional view reflecting an etching the oxide fill of the FIG. 10 in-process structure, in operations further to one example fabrication process.

FIG. 11 shows a cross-sectional view of another in-process structure 110, reflecting an etching into the temporary planar top surface 72L of the oxide fill 72 of the FIG. 10 in-process structure 100, to form a new temporary top surface 72R. The new temporary top surface 72R is at a height that exposes an upper portion 68U of each of the in-process fin stacks 64, in operations further to one example fabrication process. An enlarged area 110A shows that a bottom or lower portion 68L of each of the in-process Si fin 68 is under a top surface 72R. In another aspect (not explicitly visible in FIG. 10), the top surface 72R may be etched to fully expose the in-process Si fin 68. In other words, the etching of the oxide fill 72 of the FIG. 10 in-process structure 100 lowers the height of the upper surface of the remainder of the oxide fill 72 to a new temporary top surface 72R that exposes all, or all except for a bottom portion 68L of the in-process Si fin 68.

In an aspect, after etching of the oxide fill 72 of the FIG. 10 in-process structure 100 to expose all, or all except for a bottom portion 68L of the in-process Si fin 68. The exposure of all, or all except for a bottom portion 68L of the in-process Si fin 68 can enable, in an aspect, conversion of the all, or substantially all of the in-process Si fin 68 into an in-process SiGe fin (not explicitly visible in FIG. 11).

Figure 12:
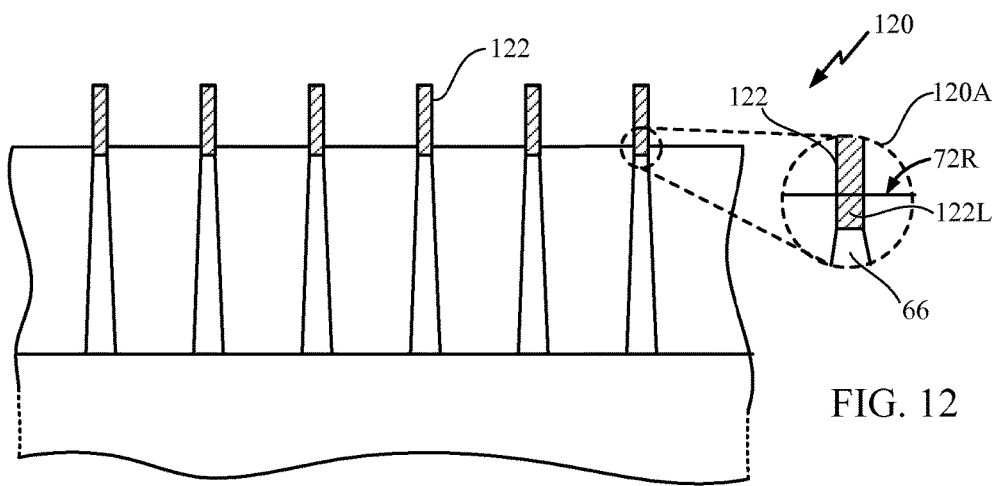
FIG. 12 shows a cross-sectional view reflecting conversion, from Si into SiGe, of lightly doped in-process Si fins at the upper portion of the FIG. 11 in-process fin stacks, to form a plurality of lightly doped SiGe in-process fins, in operations further to one example fabrication process.

FIG. 12 shows a cross-sectional view of an in-process structure 120 produced by converting the lightly doped Si material under and within the exposed upper portions 68U of the FIG. 11 in-process Si fins 68 to SiGe, in operations further to one example fabrication process. This conversion forms a plurality of lightly doped in-process SiGe fins 122

In an aspect, the height of the Si isolation intermediate upper surface may be an intermediate height, wherein the intermediate height may be above a boundary between an upper surface of the fin base and a lower surface of the in-process Si fin. In a further aspect, after converting all, or all except for a lower portion, of the in-process lightly doped Si fins to in-process lightly doped SiGe fins, a final etching may be applied to the Si isolation intermediate upper surface to form an Si isolation final upper surface, wherein the Si isolation final upper surface has a final height. In an aspect, the final height may be such that an upper portion of the fin base projects above the Si isolation.

Figure 13:
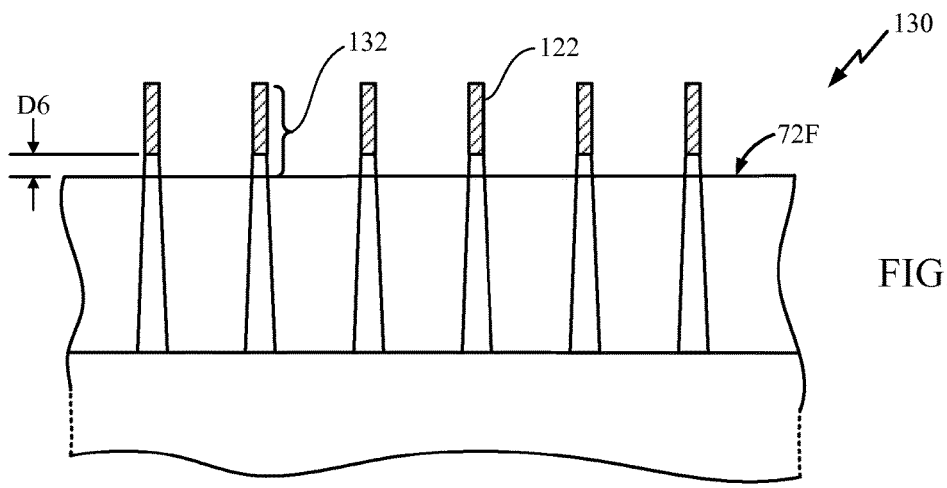
FIG. 13 shows a cross-sectional view reflecting further etching into a temporary top surface of the oxide fill surrounding the FIG. 12 the lightly doped SiGe in-process fins, in operations further to one example fabrication process.

FIG. 13 shows a cross-sectional view of an in-process structure 130, reflecting further etching into the temporary top surface 72R, to form a final top surface 72F of the oxide fill 72, surrounding the FIG. 12 in-process fin stacks, in operations further to one example fabrication process. The oxide fill 72 can provide silicon isolation in the end-process device, as will be understood by persons of ordinary skill upon reading this disclosure.

Figure 14:
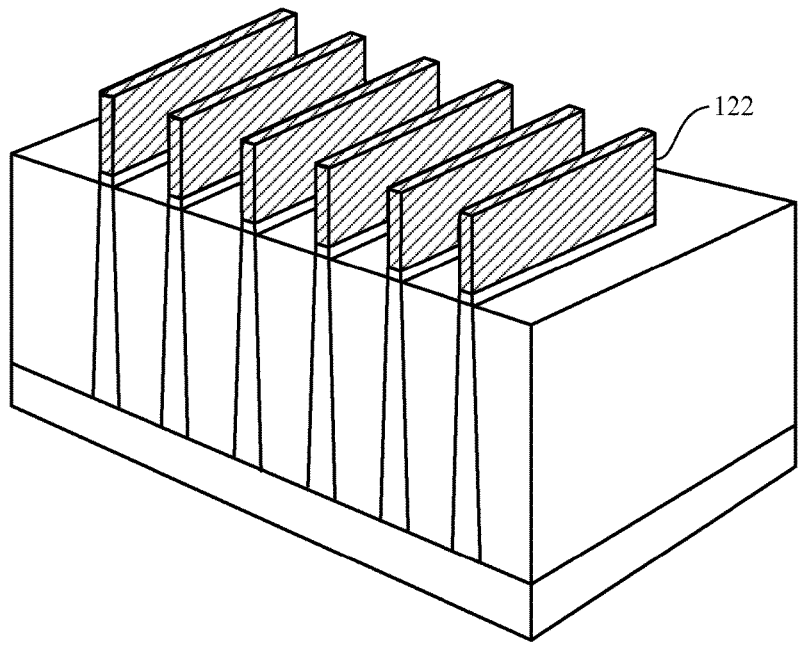
FIG. 14 shows a perspective view of the FIG. 13 in-process structure.

FIG. 14 shows a perspective view of the FIG. 13 in-process structure 130.

In an aspect, methods according to various exemplary embodiments may include forming a dummy gate, prior to depositing the epi layer on the outer surface of the source region and on the outer surface of the drain region. In an aspect, the dummy gate may cover an outer surface of the gate region of the lightly doped SiGe in-process fin.

Figure 15:
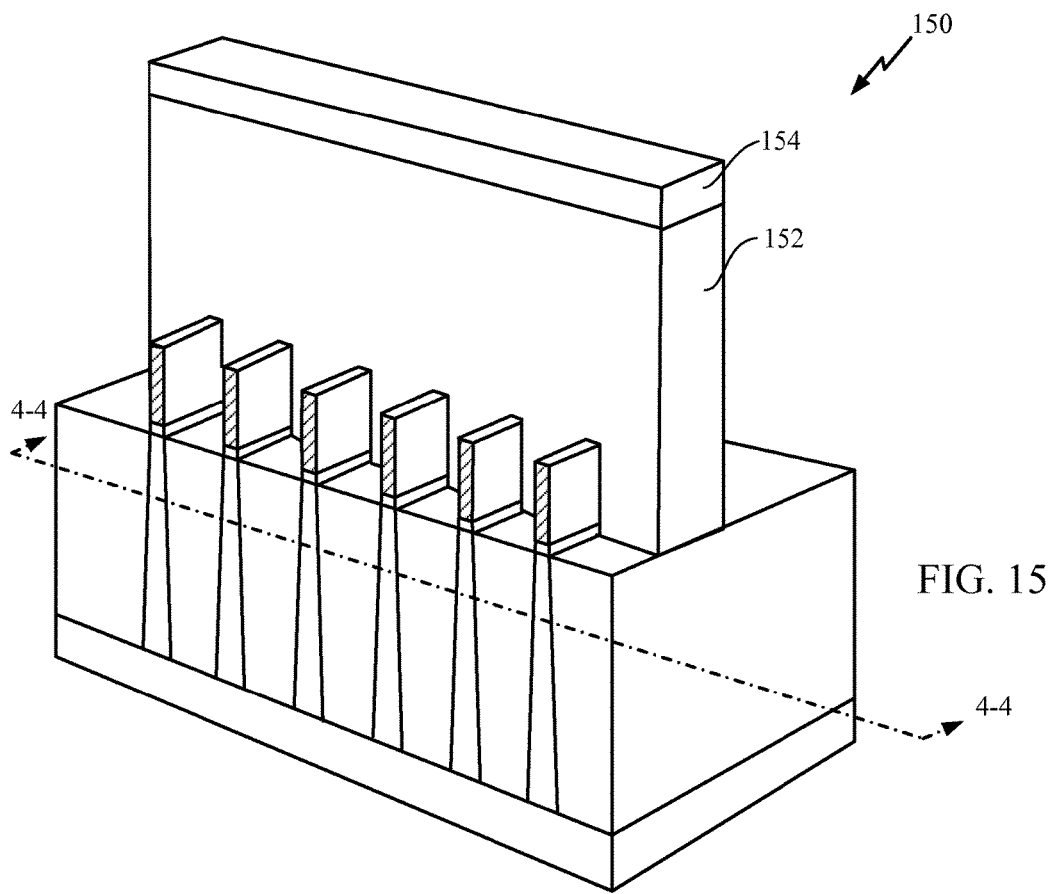
FIG. 15 shows a perspective view, reflecting a forming of a dummy gate over respective gate regions of the FIGS. 13 and 14 lightly doped SiGe fins.

FIG. 15 shows a perspective view of an in-process structure 150, reflecting a forming of a dummy gate 152 over respective gate regions (visible but not separately labeled) of the lightly doped SiGe in-process fins 122 of the FIG. 13 in-process structure 130. The forming of the dummy gate 152 may include a dummy gate mask 154. The forming of the dummy gate 152 may be according to conventional techniques for forming dummy gates as used in conventional FinFET fabrication process. Such conventional techniques, which are known to persons of ordinary skill in the art, can be readily applied by such persons upon reading the present disclosure, to practice the exemplary embodiments without undue experimentation and, therefore, further detailed description is omitted.

Figure 16:
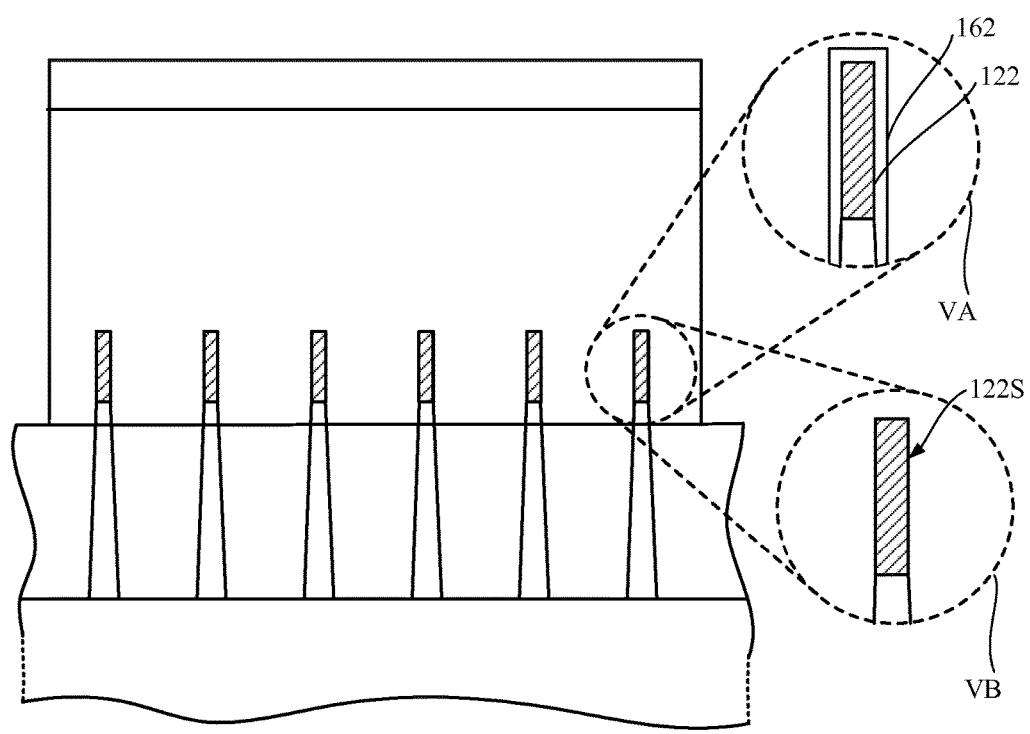
FIG. 16 is a front projection view of the FIG. 15 in-process structure, seen from that figure's projection plane 4-4, with an expanded view of one lightly doped SiGe in-process fin, showing an oxide layer and a cleaning to remove the same and expose outer surfaces of the source and drain regions

FIG. 16 is a front projection view of the FIG. 15 in-process structure 150, seen from that figure's projection plane 4-4. Expanded view VA shows an oxide layer 162 on a visible (source or drain) end of the lightly doped SiGe in-process fins 122 formed, for example, incidental to conventional techniques operations that may be applied to form the dummy gate 152. It will be understood that an oxide layer such as the oxide layer 162 may likewise form on the visible ends (in FIG. 16) of the other five lightly doped SiGe in-process fins 122. It will be similarly understood that an oxide layer such as the oxide layer 162 may form on the opposite (not visible in FIG. 16) ends of all six of the lightly doped SiGe in-process fins 122. Referring to FIG. 16, expanded view VB shows the visible end (source or drain) of the lightly doped SiGe in-process fin 122 appearing in expanded view VA, after applying an epi pre-cleaning to expose outer surfaces 122S. It will be understood epi cleaning operations applied to expose outer surfaces 122S may similarly expose outer surfaces on the ends of the other five lightly doped SiGe in-process fins 122 that are visible in FIG. 16. Likewise, epi pre-cleaning operations applied to expose outer surfaces 122S may expose the outer surfaces at the opposite ends (not visible in FIG. 16) of all six lightly doped SiGe in-process fins 122.

It will be understood that techniques that may be applied for forming the dummy gate 152 are not necessarily specific to the exemplary embodiments. For example, the dummy gate 152 may be formed by techniques, presently known or later discovered, that may not form an oxide layer such as the oxide layer 162. It will be understood that practices according to the exemplary embodiments employing such techniques, if any, that do not form an oxide layer such as the oxide layer 162 may omit, or reduce or modify application of epi pre-cleaning or other oxide removal operations as illustrated by expanded views VA and VB.

Figure 17:
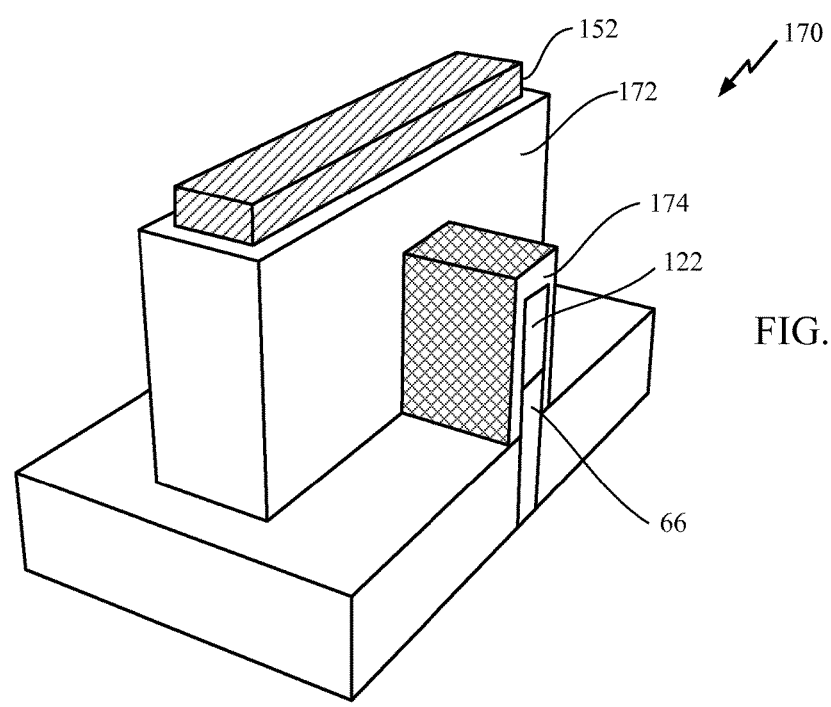
FIG. 17 shows a perspective view of a next in-process structure, resulting from applying a gate spacer patterning, and applying an SiGeB epi growth process to form an SiGeB epi layer covering the exposed outer surfaces of the source and drain regions.

FIG. 17 shows a perspective view of a next in-process structure 170, resulting from applying a gate spacer patterning to form a gate spacer 172, and applying a SiGeB epi growth process to form a SiGeB epi layer 174. The SiGeB epi growth process may be configured to form the SiGeB epi layer 174 in a manner covering the exposed outer surfaces (e.g. 122S visible in the FIG. 16 expanded view VB) of the source and drain regions. In an aspect, the SiGeB epi growth process forming the SiGeB epi layer 174 may be a portion of novel in-situ boron doping methods according to, and provided by, various exemplary embodiments, as will be later described in further detail. Further to this in-site boron doping aspect, a drive-in annealing (not visible in FIG. 17) may be applied to the FIG. 17 in-process structure, to diffuse boron from the SiGeB epi layer 174 into the source regions, and into drain regions of the SiGe in-process fins 122, to form a boron-doped SiGe source region and boron-doped SiGe drain region (not yet formed in the snapshot reflected by FIG. 17).

Regarding the concentration of boron in the SiGeB epi layer 174, persons of ordinary skill in the art, upon reading the present disclosure, will understand factors on which that concentration may depend. For example, such persons will understand, upon reading the present disclosure, that the range of boron concentration in the SiGeB epi layer 174 can depend at least in part, on the desired range of boron dopant concentration in the source and drain regions that may be obtained through subsequent drive-in anneal process. Persons of ordinary skill in the art, upon reading the present disclosure and being provided, or selecting, application-specific parameters (e.g., geometry of the end product FinFET, target performance of the end product FinFET) can readily determine that the corresponding range of boron dopant for the SiGeB epi layer 174, without undue experimentation, by applying standard engineering methodologies such persons know, to concepts and examples disclosed herein. For purposes of illustration, one example range of boron concentration that may be used in forming a SiGeB epi layer such as the SiGeB epi layer 174, for some applications, may span from, for example, less than 1E20 at/cm3 and may encompass, for example, greater than 2E20 at/cm3. It will be understood that this example range of boron concentration in the SiGeB epi layer 174 is only for purposes of illustration, and is not intended to limit the scope of any of the embodiments or any aspect of any embodiment.

Figure 18:
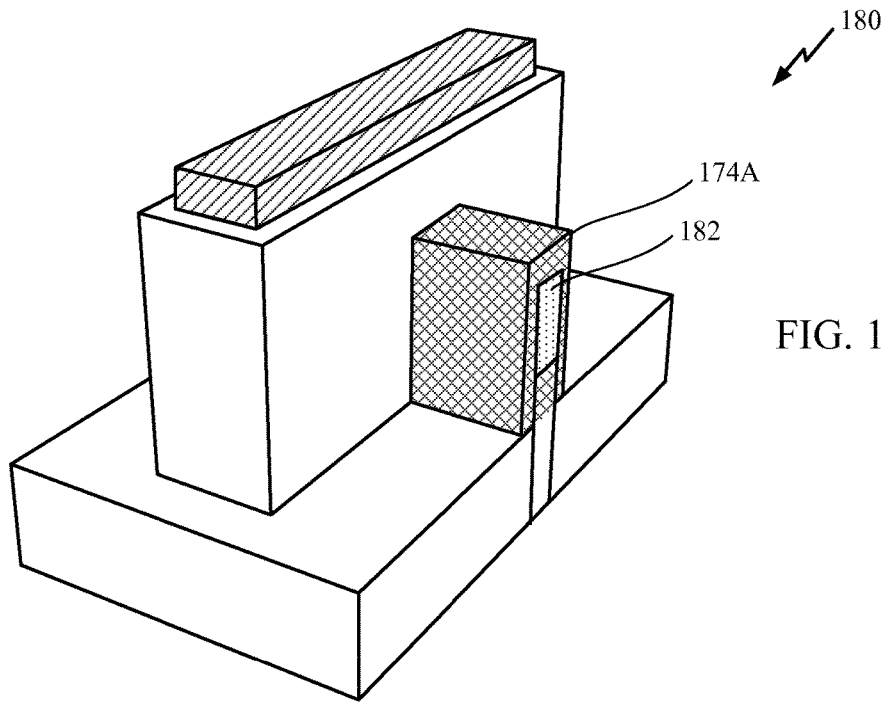
FIG. 18 shows a perspective view of an end-process structure, obtained by applying a drive-in annealing to the FIG. 17 in-process structure, to drive in B from the SiGeB epi layer, into the source and drain regions, forming B implanted SiGe source and drain regions, respectively covered with conductive SiGeB epi layer, in operations further to one example process.
Figure 19:
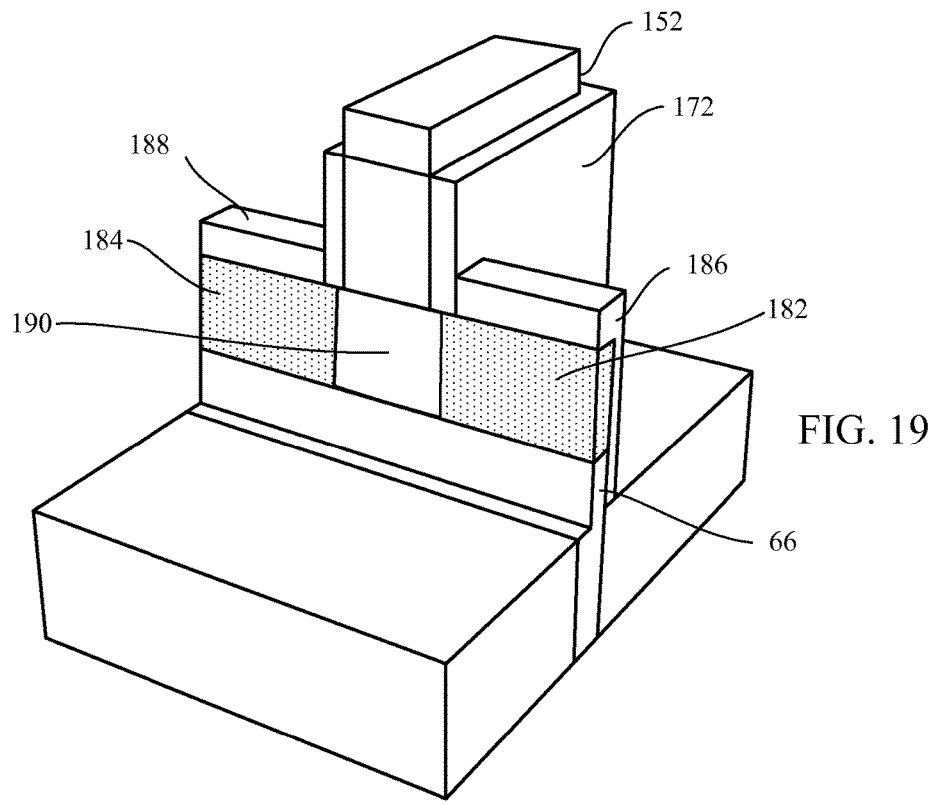
FIG. 19 is a partial cut-away of FIG. 18.

FIG. 18 shows a perspective view of an end-process structure 180, obtained by a drive-in annealing that completes an in-situ boron doping of the source region and drain region, in processes according to exemplary embodiments. In an aspect, the drive-in annealing combines with, and furthers operation of the SiGeB epi layer formed as described in reference to FIG. 17. FIG. 19 shows a partial cut-away of the FIG. 18 end-process structure 180.

The drive-in annealing can be configured to apply a pre-determined temperature, TM, for a pre-determined time duration, DR. Factors considered in determining TM and DR can include desired dopant diffusion and, since the SiGe in-process fins 122 are formed of SiGe, avoidance of strain relaxation. Specific ranges of numerical values for TM and DR may be, in part, application-specific. Persons of ordinary skill, upon reading the present disclosure, can determine ranges of TM and DR for various given applications, without undue experimentation. For purposes of illustration, example values for TM and DR can include TM being in a range spanning from approximately 900 degrees C. to approximately 1050 degrees C., with a corresponding DR of approximately one second. Example values for TM and DR can also include TM being in a range spanning from approximately 1200 degrees C. to approximately 1300 degrees C., with a corresponding DR of approximately one millisecond. It will be understood that the example ranges of TM and DR only for purposes of illustration, and is not intended to limit the scope of any of the embodiments or any aspect of any embodiment.

Referring to FIGS. 18 and 19, the drive-in annealing operations can be configured to diffuse boron from the FIG. 17 SiGeB epi layer 174, into the source regions and drain regions of the SiGe in-process fins 122, to form a boron-doped SiGe source region 182 and a boron-doped SiGe drain region 184. In a further aspect, a portion of the FIG. 17 SiGeB epi layer 174 that, in FIGS. 18 and 19, covers what is now (in FIGS. 18 and 19) the boron-doped SiGe source region 182 will be referred as the "SiGeB source epi layer" 186. Similarly, a portion of the FIG. 17 SiGeB epi layer 174 that covers what is now (in FIGS. 18 and 19), the boron-doped SiGe drain region 184 will be referred as the "SiGeB drain epi layer" 188.

Regarding structure and composition of the SiGeB source epi layer 186 and SiGeB drain epi layer 188, it will be understood that due to various operations of the drive-in annealing these structures may have differences from the SiGeB epi layer 174, for example, reduction in boron concentration. However, in an aspect, the FIG. 17 SiGeB epi layer 174 may be configured with a boron concentration to provide a high remnant B concentration in the SiGeB source epi layer 186 and SiGeB drain epi layer 188. This aspect may provide, for example, features and benefits such as providing source and drain junctions over the entire channel height of the SiGe fin. Referring to FIG. 19, a gate region 190, comprising lightly doped SiGe material of the lightly doped SiGe in-process fins 122.

Since the drive-annealing diffused boron from the SiGeB epi layer 174, it will be understood that the concentration of boron in the SiGeB epi layer 174 will determine, at least in part, the concentration of boron in the boron-doped SiGe source region 182, as well as in the boron-doped SiGe drain region 184, the SiGeB source epi layer 186 and the SiGeB drain epi layer 188. Persons of ordinary skill in the art, upon reading this disclosure, will understand that desired, or target ranges of boron in these FIGS. 18 and 19 structures may be, at least in part, application specific. However, upon reading this disclosure and having a defined application, persons of ordinary skill can readily determine target ranges of boron in the FIGS. 18 and 19 structures, without undue experimentation, by applying standard engineering methodologies such persons know, to concepts and examples disclosed herein. Based on such target ranges, persons of ordinary skill can then determine a target range of boron in the FIG. 17 SiGeB epi layer 174, without undue experimentation.

Features and advantages of disclosed embodiments may include, but are not limited to, eliminating source and drain contacts to a parasitic n-Si resistor under SiGe sources and drains. This and other features and benefits can be provided by the described counter-doping the exposed n-source and n-drain with boron. Other features and aspect may include, without limitation, providing source and drain junctions over an entire SiGe channel height. Further benefits and advantages can include, for example, a provision of gate overlap with the SiGe and the ground plane. Persons of ordinary skill in the art will also appreciate, upon reading this disclosure, that FinFETs processed and structured according to various exemplary embodiments will maintain low drive current contribution from parasitic Si-based transistor because of, for example, higher threshold voltage and reduced carrier mobility relative to SiGe. Such persons will also appreciate, among other features and benefits provided by the disclosed embodiments, that the disclosed raised source and drain epitaxy can eliminate recessing of a SiGe source and drain and that this can provide, in turn, a minimizing of elastic channel relaxation.

Figure 20:
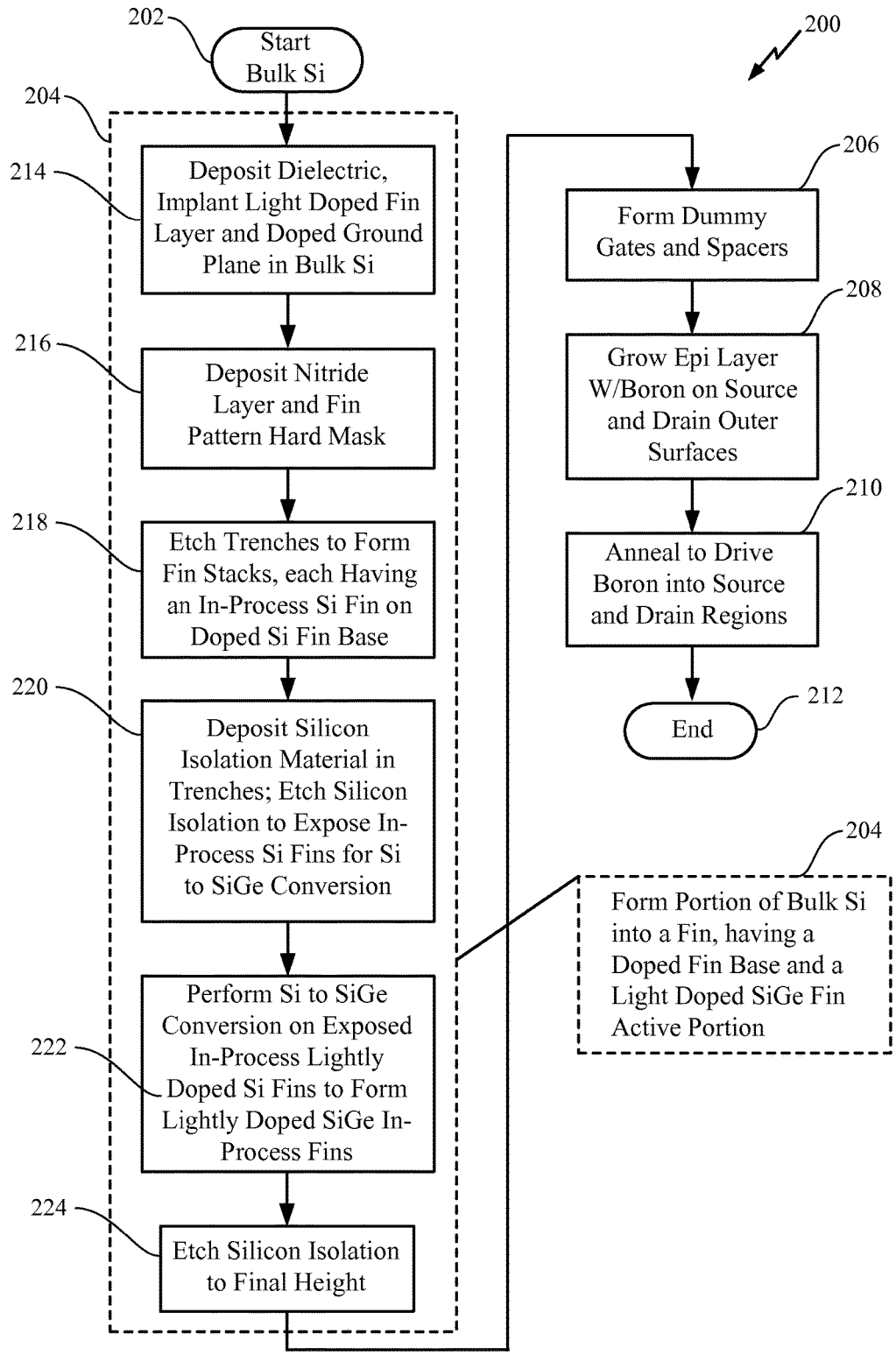
FIG. 20 a high-level logical flow diagram of example operations in part of one or more processes in accordance with various exemplary embodiments.

FIG. 20 is a high-level flow diagram 200 of operations forming part of a fabrication process according to various exemplary embodiments. For brevity, the phrase "in the flow 200" is used, and will be understood to mean "in a process that may include operations having a logical flow as represented by the high-level flow diagram 200."

Referring to FIG. 20, operations in the flow 200 may begin at an arbitrary start 202, which may include, for example, providing a starting bulk silicon such as the bulk silicon 10 described in reference to FIGS. 1A, 1B and other of the attached figures. Operations in the flow 200 may then, at 204, form a portion of bulk Si into a fin stack, or a plurality of fin stacks. Each fin stack may include a doped Si fin base and, on the doped Si fin base, a lightly doped in-process SiGe fin. One flow of example operations at 204 is shown on FIG. 20, and that one flow will be later described in further detail. Referring to FIGS. 13 and 14, one example structure formed at 204 may be the in-process structure 130, with the doped Si fin base 66 and lightly doped SiGe in-process fin 122.

With continuing reference to FIG. 20, operations in the flow, after 204, may include, at 206, forming dummy gates and spacers. Referring to FIG. 17, the example dummy gate 152 and gate spacer 172 may be an example of structure formed at 206. Referring to FIG. 20, a next operation in the flow 200 may be, at 208, growing an epi layer, of a material that includes boron, on source and drain outer surfaces of the lightly doped SiGe in-process fin formed at 204. In an aspect, operations at 208 may include an epi pre-cleaning, for example, to remove oxides deposited on the source and drain outer surfaces during the formation of the dummy gates or other operations. Referring to FIG. 16, the removal of the oxide layer 162, as shown in expanded views VA and VB, may reflect one example of pre-cleaning operations at 208.

Referring to FIG. 20, after growing the epi layer at 208, operations in the flow 200 may include, at 210, an annealing to diffuse boron from that epi layer into the source region and drain region, to effectively dope these regions with boron. Referring to FIGS. 17 and 18, annealing operations forming the boron doped SiGe source region 182 and the boron doped drain SiGe region 184 may reflect one example of operations at 210. The operations at 208 and 210 may be collectively referred to as examples of in-situ doping boron in the drain region and in the source region of the lightly doped SiGe in-process fin to form an end-process lightly doped SiGe active fin, with B-doped source and drain regions. The end-process lightly doped SiGe active fin, with B-doped source and drain regions may also include a SiGeB source epi layer (e.g., FIG. 18, 174A) and a SiGeB drain epi layer (e.g., FIG. 18, 174B), which can operate as source and drain contacts respectively. Example operations in the flow 200 may, after the annealing at 210, end the flow at 212.

FIG. 20 shows one example flow of operations that may be performed at, or associated with 204. Operations at 204 may start at 214 with depositing a dielectric layer on a top surface of the bulk Si, and implanting a lightly doped fin layer and underlying ground plane in the bulk Si. Referring to FIGS. 2 and 3, one example of operations at 214 may be the described deposition of the dielectric layer 22 and implanting, through the dielectric layer, the lightly doped Si layer 32 above the doped ground plane layer 34. Next, at 216, a nitride layer may be formed, for example, on the dielectric layer and on the nitride layer, and a fin pattern hard mask may be disposed, for example, as described in reference to FIGS. 4 and 5.

Continuing to refer to FIG. 20, operations in the flow performing at 204 may include, at 218, etching trenches in the structure formed at 214, using the fin pattern hard mask formed at 216, to form fin stacks. In an aspect, each fin stack may have an in-process lightly doped Si fin on a doped Si fin base, such as the in-process fin stacks 64 described in reference to FIG. 6. Example operations in the flow at 204 may include a depositing, at 220, of silicon isolation material in the trenches, and etching a top surface of the silicon isolation material to expose (or expose all except for a lower portion of) the in-process Si fins for Si-to-SiGe conversion, as described, for example, in reference to FIGS. 7-11.

Referring to FIG. 20, operations in the flow performed at 204 may include, at 222, converting the lightly doped Si in-process fins formed at 220 to lightly doped SiGe in-process fins. Referring to FIGS. 12 and 20, the operations reflected by forming the FIG. 12 lightly doped SiGe in-process fins 122 may be one example of operations performed at 222. Next, at 224, an etching of the silicon isolation material may be performed, to lower the upper surface of the silicon isolation material to a final height, e.g., the upper surface 72F described in reference to FIG. 13, for the epi growth and boron drive-in operations at 208 and 210.

Figure 21:
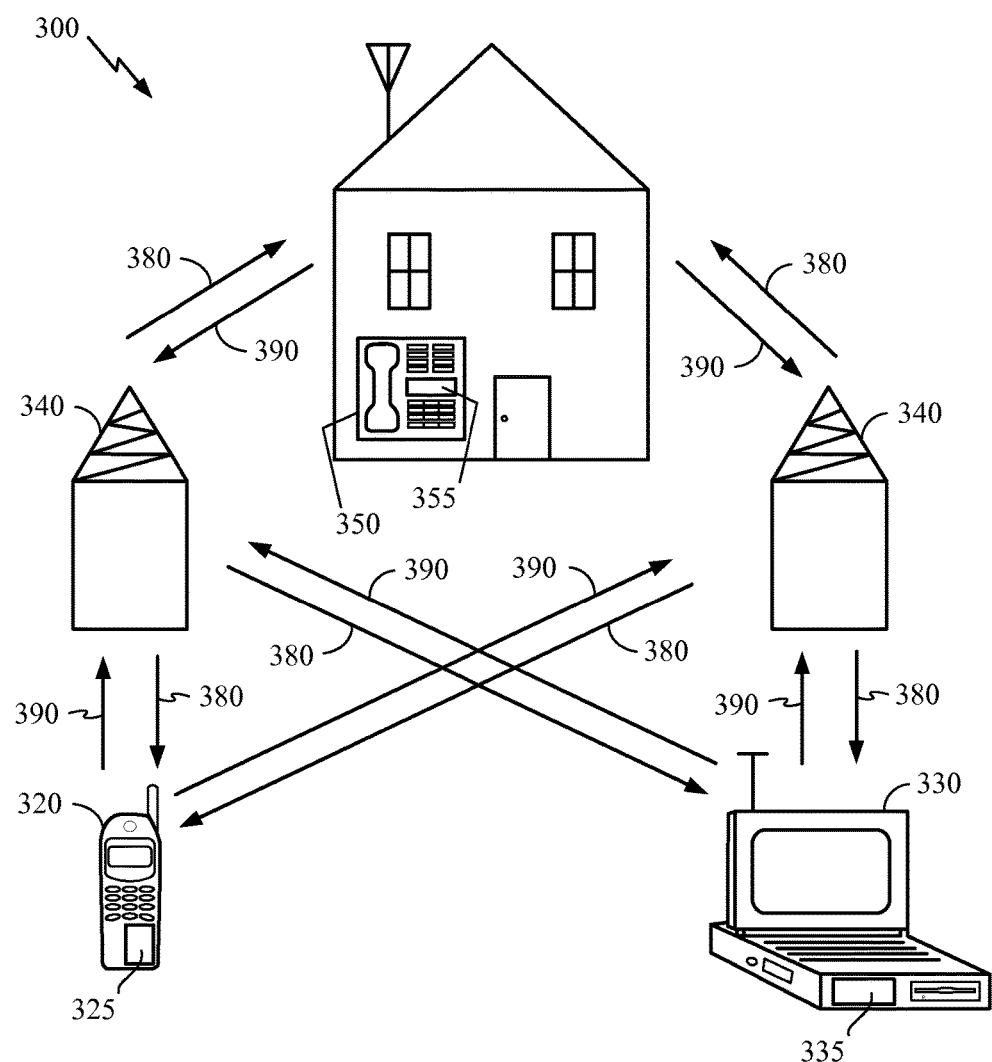
FIG. 21 shows a functional schematic of one example system of communication and computing devices having combinations of stressed fin NMOS FinFET devices in accordance with one or more exemplary embodiments.

FIG. 21 illustrates an exemplary wireless communication system 300 in which one or more embodiments of the disclosure may be advantageously employed. For purposes of illustration, FIG. 21 shows three remote units 320, 330, and 350 and two base stations 340. It will be recognized that conventional wireless communication systems may have many more remote units and base stations. The remote units 320, 330, and 350 include integrated circuit or other semiconductor devices 325, 335 and 355 (including on-chip voltage regulators, as disclosed herein), employing stressed fin NMOS FinFET devices, for example, as described in reference to FIGS. 1A-1D and 2A-2G. FIG. 21 shows forward link signals 380 from the base stations 340 and the remote units 320, 330, and 350 and reverse link signals 390 from the remote units 320, 330, and 350 to the base stations 340.

In FIG. 21, the remote unit 320 is shown as a mobile telephone, the remote unit 330 is shown as a portable computer, and the remote unit 350 is shown as a fixed location remote unit in a wireless local loop system. For example, the remote units may be any one or combination of a mobile phone, hand-held personal communication system (PCS) unit, portable data unit such as a personal data assistant (PDA), navigation device (such as GPS enabled devices), set top box, music player, video player, entertainment unit, fixed location data unit such as meter reading equipment, or any other device that stores or retrieves data or computer instructions, or any combination thereof. Although FIG. 21 illustrates remote units according to the teachings of the disclosure, the disclosure is not limited to these exemplary illustrated units. Embodiments of the disclosure may be suitably employed in any device having active integrated circuitry including memory and on-chip circuitry for test and characterization.

The foregoing disclosed devices and functionalities may be designed and configured into computer files (e.g., RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

While the foregoing disclosure shows illustrative embodiments of the disclosure, it should be noted that various changes and modifications could be made herein without departing from the scope of the disclosure as defined by the appended claims. The functions, steps and/or actions of the method claims in accordance with the embodiments of the disclosure described herein need not be performed in any particular order. Furthermore, although elements of the disclosure may be described or claimed in the singular, the plural is contemplated unless limitation to the singular is explicitly stated.

What is claimed is:

1. A method for fabricating a FinFET on a bulk silicon (Si), comprising:
    forming a fin stack, wherein the forming the fin stack is performed in a portion of the bulk Si, wherein the fin stack is formed with a fin base, and wherein the forming the fin stack comprises forming, on the fin base, a silicon germanium (SiGe) in-process fin; and
    in-situ boron doping a region of the SiGe in-process fin.

2. The method of claim 1, wherein the in-situ boron doping the region of the SiGe in-process fin comprises:
    depositing an epi layer, wherein the epi layer comprises boron, wherein the epi layer is formed on an outer surface of the region of the SiGe in-process fin; and
    applying a drive-in annealing, wherein the drive-in annealing is configured to diffuse the boron from the epi layer into the region of the SiGe in-process fin.

3. The method of claim 2, wherein the forming the fin stack is configured to form the SiGe in-process fin as a lightly doped SiGe in-process fin.

4. The method of claim 2, wherein the epi layer comprises silicon germanium boron (SiGeB).

5. The method of claim 2, wherein a concentration of the boron in the epi layer is in a range that spans from approximately 1E20 atoms per cubic centimeter (at/cm$^3$) to approximately 2E20 at/cm$^3$.

6. The method of claim 1, wherein the SiGe in-process fin comprises a source region, and wherein the in-situ boron doping the region of the SiGe in-process fin is performed in at least a portion of the source region.

7. The method of claim 6, wherein the in-situ boron doping the portion of the source region of the SiGe in-process fin comprises:
    depositing an epi layer, wherein the epi layer comprises boron, wherein the epi layer is formed on an outer surface of at least the portion of the source region; and applying a drive-in annealing, wherein the drive-in annealing is configured to diffuse the boron from the epi layer into at least the portion of the source region.

8. The method of claim 1, wherein the SiGe in-process fin comprises a source region and a drain region, and wherein the in-situ boron doping the region of the SiGe in-process fin comprises:
   depositing an epi layer, wherein the epi layer comprises boron, wherein the epi layer is formed on an outer surface of the source region and on an outer surface of the drain region; and
   applying a drive-in annealing, wherein the drive-in annealing is configured to diffuse the boron from the epi layer into the source region and into the drain region.

9. The method of claim 8, wherein the epi layer comprises silicon germanium boron (SiGeB).

10. The method of claim 8, wherein the SiGe in-process fin further comprises a gate region.

11. The method of claim 10, wherein the method further comprises:
   prior to depositing the epi layer on the outer surface of the source region and on the outer surface of the drain region,
      forming a dummy gate, wherein the dummy gate is configured to cover an outer surface of the gate region; and
      applying an epi pre-cleaning to expose the outer surface of the source region and the outer surface of the drain region.

12. The method of claim 1, wherein the forming the fin stack further comprises:
   forming a portion of the bulk Si into an in-process fin stack, wherein the in-process fin stack includes the fin base and, on the fin base, an in-process Si fin; and
   converting at least a portion of the in-process Si fin into the SiGe in-process fin, wherein the in-process Si fin is a lightly doped in-process Si fin and the SiGe in-process fin is a lightly doped SiGe in-process fin.

13. The method of claim 12, wherein the forming the portion of the bulk Si into the in-process fin stack comprises:
   forming, under a surface of the bulk Si, a lightly doped Si layer and, under the lightly doped Si layer, a doped Si ground plane layer; and
   etching the doped Si ground plane layer and the lightly doped Si layer to form the in-process fin stack, wherein the fin base comprises a region of the doped Si ground plane layer and the in-process Si fin comprises a region of the lightly doped Si layer.

14. The method of claim 1, wherein an epi layer formed on an outer surface of the region of the SiGe in-process fin comprises silicon germanium boron (SiGeB).

15. The method of claim 1, wherein the forming the fin stack further comprises:
   forming an in-process fin stack having the fin base and, on the fin base, an in-process Si fin; and
   converting the in-process Si fin into the SiGe in-process fin.

16. The method of claim 15, wherein the in-situ boron doping the region of the SiGe in-process fin comprises:
   depositing an epi layer, wherein the epi layer comprises boron, wherein the epi layer is on an outer surface of the region of the SiGe in-process fin; and
   applying a drive-in annealing, wherein the drive-in annealing is configured to diffuse the boron from the epi layer into the region of the SiGe in-process fin.

17. The method of claim 16, wherein the SiGe in-process fin includes a gate region, and wherein the method further comprises:
   prior to depositing the epi layer on the outer surface of the region of the SiGe in-process fin,
      forming a dummy gate, wherein the dummy gate is configured to cover an outer surface of the gate region; and
      applying an epi pre-cleaning to expose the outer surface of the region of the SiGe in-process fin.

* * * * *